United States Patent
Kim et al.

(10) Patent No.: US 9,435,852 B1
(45) Date of Patent: Sep. 6, 2016

(54) INTEGRATED CIRCUIT (IC) TEST STRUCTURE WITH MONITOR CHAIN AND TEST WIRES

(71) Applicant: GLOBALFOUNDRIES Inc., Grand Cayman (KY)

(72) Inventors: Andrew T. Kim, Poughkeepsie, NY (US); Cathryn J. Christiansen, Huntington, VT (US); Ping-Chuan Wang, Hopewell Junction, NY (US)

(73) Assignee: GlobalFoundries, Inc., Grand Cayman (KY)

( * ) Notice: Subject to any disclaimer, the term of this patent is extended or adjusted under 35 U.S.C. 154(b) by 0 days.

(21) Appl. No.: 14/862,587

(22) Filed: Sep. 23, 2015

(51) Int. Cl.
*H01L 23/48* (2006.01)
*G01R 31/28* (2006.01)
*H01L 23/528* (2006.01)
*H01L 23/522* (2006.01)
*H01L 21/66* (2006.01)

(52) U.S. Cl.
CPC ........... *G01R 31/2884* (2013.01); *H01L 22/30* (2013.01); *H01L 23/528* (2013.01); *H01L 23/5226* (2013.01)

(58) Field of Classification Search
USPC .......................................................... 257/48
See application file for complete search history.

(56) References Cited

U.S. PATENT DOCUMENTS

| | | | |
|---|---|---|---|
| 6,202,191 B1* | 3/2001 | Filippi | G06F 17/5077 257/522 |
| 6,362,634 B1 | 3/2002 | Jarvis et al. | |
| 6,396,143 B1* | 5/2002 | Kimbara | H01L 21/4857 257/712 |
| 6,576,923 B2 | 6/2003 | Satya et al. | |
| 7,026,175 B2 | 4/2006 | Li et al. | |
| 7,198,963 B2 | 4/2007 | Verma et al. | |
| 7,902,849 B2 | 3/2011 | Bullock | |
| 7,969,564 B2 | 6/2011 | Almogy et al. | |
| 8,125,233 B2 | 2/2012 | Chen et al. | |
| 8,623,673 B1 | 1/2014 | Dyer et al. | |
| 8,717,059 B2* | 5/2014 | Kim | H01L 24/05 324/762.01 |
| 2014/0339558 A1 | 11/2014 | Chen et al. | |

* cited by examiner

*Primary Examiner* — Thao P Le
(74) *Attorney, Agent, or Firm* — Hoffman Warnick LLC; David Cain

(57) ABSTRACT

Aspects of the present disclosure provide an integrated circuit (IC) test structure. An IC structure according to the present disclosure can include: a monitor chain having a first end electrically connected to a second end through a plurality of metal wires each positioned within one of a first metal level and a second metal level, wherein the first metal level is vertically separated from the second metal level; a first test wire positioned within the first metal level and extending in a first direction, wherein the first test wire is electrically insulated from the monitor chain; and a second test wire positioned within the second metal level and extending in a second direction, wherein the second test wire is electrically insulated from the monitor chain and the first test wire, and wherein the first direction is different from the second direction.

20 Claims, 5 Drawing Sheets

INTEGRATED CIRCUIT (IC) TEST STRUCTURE WITH MONITOR CHAIN AND TEST WIRES

BACKGROUND

The subject matter disclosed herein relates to methods and test structures for integrated circuits (ICs). More specifically, aspects of the invention relate to test and monitoring structures which can measure the reliability of an IC chip and its components, e.g., metal level layers and interlayer dielectrics therein.

Each IC of a particular device can be made up of billions of interconnected devices, such as transistors, resistors, capacitors, and diodes, located on one or more chips of semiconductor substrate material. The quality and viability of a product including an IC can be at least partially dependent on the techniques used for fabricating the IC and the structure of various components therein. Fabrication of an IC can include two phases: front-end-of-line processes (FEOL) and back-end-of-line processes (BEOL). FEOL generally includes fabrication processes performed on a wafer up to and including the formation of a first "metal level," i.e., a metal wire for connecting several semiconductor devices together. BEOL generally includes fabrication processes following the formation of the first metal level, including the formation of all subsequent metal levels. To provide greater scaling and sophistication of the fabricated device, the number of metal levels can be varied to suit a particular application, e.g., by providing four to six metal levels, or as many as, in a further example, sixteen or more metal levels.

Two or more metal levels can be electrically interconnected by the use of vertical metal wires, also known as "vias." Each via can traverse one or more regions of interlayer dielectric material, in addition to other intervening metal levels. Vias can present a significant manufacturing challenge, because a single broken contact or electrical short can affect the operation of an entire product. As a result, accurate prediction or signaling of chip-level failure rate can be especially significant where, e.g., interlayer dielectrics are particularly thin and where a large number of vias are included. Conventional test structures can include long, intertwined conductive chains of metal wires. These types of test structures may be highly resistive and cause overestimations of failure rate because of the test current and "leakage" currents being of similar magnitude. Alternative test structures may be more sensitive to changes in current, but may not test for a worst-case scenario due to differences in their underlying structure.

BRIEF SUMMARY

A first aspect of the present disclosure provides an integrated circuit (IC) test structure including: a monitor chain having a first end electrically connected to a second end through a plurality of metal wires each positioned within one of a first metal level and a second metal level, wherein the first metal level is vertically separated from the second metal level; a first test wire positioned within the first metal level and extending in a first direction, wherein the first test wire is electrically insulated from the monitor chain; and a second test wire positioned within the second metal level and extending in a second direction, wherein the second test wire is electrically insulated from the monitor chain and the first test wire, and wherein the first direction is different from the second direction.

A second aspect of the present disclosure provides an integrated circuit (IC) test structure including: a monitor chain having a first end electrically connected to a second end through a plurality of metal wires each positioned within one of a first metal level and a second metal level, wherein the first metal level is vertically separated from the second metal level; a first test wire positioned within the first metal level and extending in a first direction, wherein the first test wire is electrically insulated from the monitor chain; and a second test wire positioned within the second metal level and extending in a second direction, wherein the first direction is different from the second direction; an interconnect via electrically coupled to one of the first test wire and the second test wire, and extending from the first metal level to the second metal level.

A third aspect of the present disclosure provides an integrated circuit (IC) test structure including: a monitor chain having a first end electrically connected to a second end through a plurality of metal wires each positioned within one of a first metal level and a second metal level, wherein the first metal level is vertically separated from the second metal level; a plurality of first test wires each positioned within the first metal level and extending in a first direction, wherein each of the plurality of first test wires is electrically insulated from the monitor chain and positioned laterally between two of the plurality of metal wires; and a plurality of second test wires each positioned within the second metal level and extending in a second direction, wherein each of the plurality of second test wires is electrically insulated from the monitor chain and positioned laterally between two of the plurality of metal wires, and wherein the first direction is different from the second direction.

BRIEF DESCRIPTION OF THE DRAWINGS

These and other features of this invention will be more readily understood from the following detailed description of the various aspects of the invention taken in conjunction with the accompanying drawings that depict various embodiments of the invention, in which.

It is noted that the drawings of the invention are not to scale. The drawings are intended to depict only typical aspects of the invention, and therefore should not be considered as limiting the scope of the invention. In the drawings, like numbering represents like elements between the drawings.

DETAILED DESCRIPTION

Various aspects of the present disclosure can provide an integrated circuit (IC) test structure which offers sensitivity to errors or defects, along with an ability to test a wide array of test cases, e.g., whether via-to-via and/or via-to-wire faults are present. In an embodiment, an IC test structure according to the present disclosure can include, as one component, a monitor chain with a first end electrically connected to a second end through metal wires each positioned within a first or second metal level of the IC. As used herein, the term "monitor chain" generally refers to an electronic circuit composed of metal wires and vias positioned within two or more metal level layers, and which can be structured to include a serpentine structure. A monitor chain with a serpentine structure can include, e.g., sections which wrap laterally and/or vertically around other circuit elements, thereby providing a circuit which is proximal to and electrically isolated from other circuit elements. In the event of a material failure, a monitor chain positioned within the same material may break and thereby yield a zero current when subjected to a test voltage. The first and second metal levels of an IC can be vertically separated from each other, and the monitor chain itself can be provided as serpentine monitor chain in which, for example, metal wires within the first metal level each extend in a first direction, while each metal wire within the second metal level can each extend in a second, different direction. In addition to the monitor chain, the IC test structure can also include one or more first test wires positioned within the first metal level yet electrically insulated from the monitor chain, such that the first test wires extend substantially in parallel with the metal wires of the monitor chain within the second metal level. The IC structure can also include one or more second test wires positioned within the second metal level and extending in the second direction, but electrically insulated from the monitor chain and the first test wires.

Figure 1:
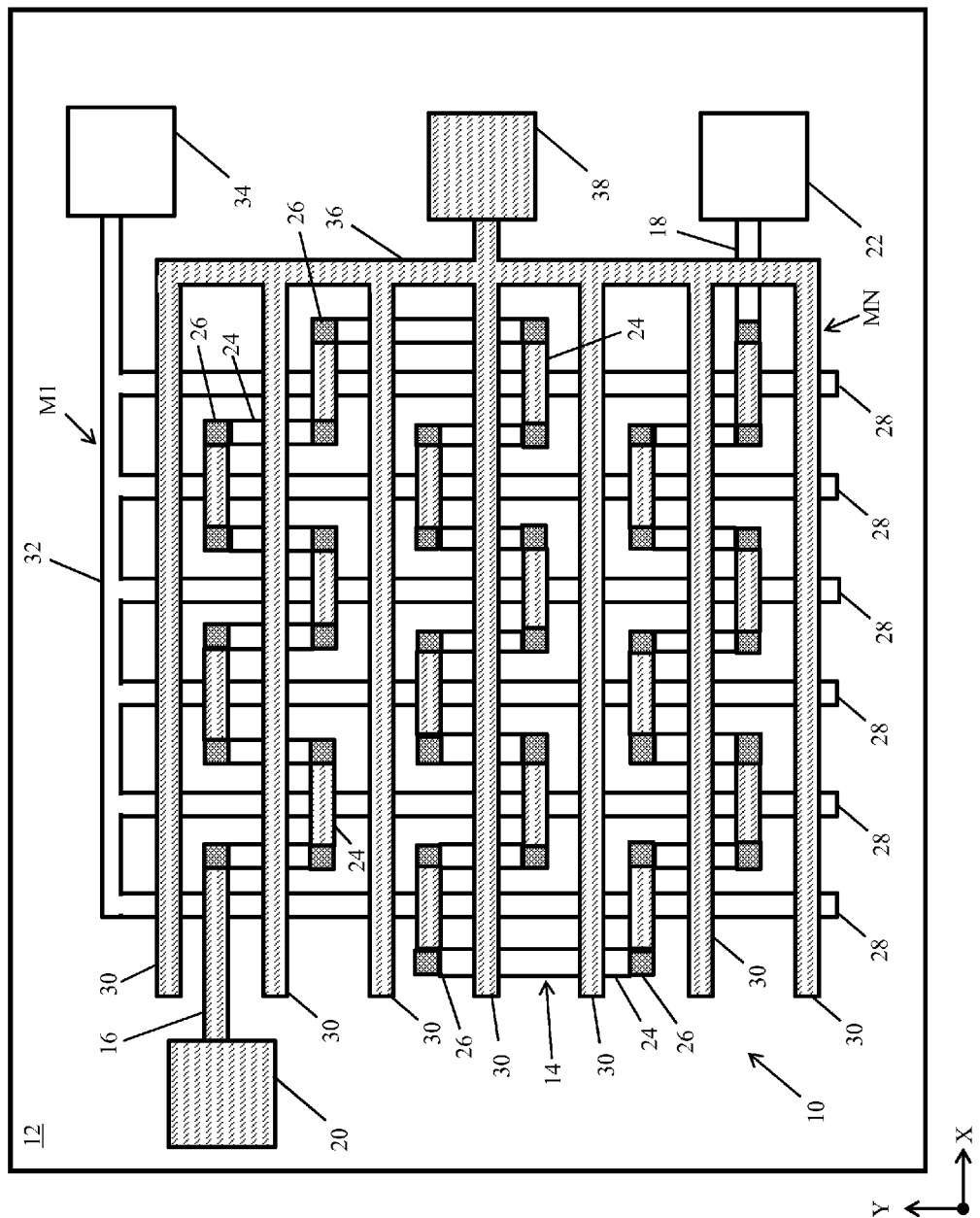
FIG. 1 shows a plan view in plane X-Y of an IC test structure according to embodiments of the present disclosure.

Referring to FIG. 1, a plan view of an IC test structure 10 according to embodiments of the present disclosure is shown. IC test structure 10 can be positioned within an IC chip 12 which includes multiple layers therein, at least two of those layers being provided as respective first and second metal levels. In FIG. 1 (in addition to FIGS. 4 and 5), elements positioned within a first metal level M1 are denoted without cross-hatching while elements positioned within a second metal level MN are denoted with cross-hatching. Cross-sectional side views of metal levels M1, MN are provided in FIGS. 2 and 3 and discussed elsewhere herein for further illustration. First and second metal levels M1, MN can be vertically separated from each other (e.g., along axis "Z" shown in FIGS. 2 and 3), either as directly adjacent metal levels or with intervening metal and insulator levels (omitted from FIG. 1) positioned therebetween.

IC test structure 10 can include a monitor chain 14 extending between a first end 16 and a second end 18 to form a continuous circuit with a serpentine path, including portions within first metal level M1 and second metal level MN of IC chip 12. First end 16 can be electrically coupled to a first test pad 20, while second end 18 can be electrically coupled to a second test pad 22. Although first end 16 and first test pad 20 are shown to be in second metal level MN while second end 18 and second test pad 22 are shown to be in first metal level M1, it is understood that monitor chain 14 can start and end in the same metal level while extending through a different metal level at a portion thereof. Monitor chain 14 can include a plurality of metal wires 24, each of which can be composed of any currently known or later-developed electrically conductive material including, e.g., copper (Cu), aluminum (Al), silver (Ag), gold (Au), combinations thereof, etc. During operation, test currents and/or voltages can be applied to monitor chain 14 to yield an electrical response. The electrical response yielded from monitor chain 14, and other conductive portions of IC test structure 10 discussed herein, can include any type of information relevant to the status of IC chip 12, e.g., when a particular wire or circuit is broken, when or where a change in electrical resistance occurs, etc. Any change in the response from test to test can indicate a structural issue with IC chip 12, for example, a crack or warping. Therefore, electrical information regarding the circuit can be used to determine whether IC chip 12 has been compromised during fabrication and/or after deployment. Processing of test results can be performed, e.g., by compiling response data relating to each circuit and/or wire on IC chip 12, compiling response data obtained from each tested portion of IC chip 12, noting when a change in electrical behavior occurs, and thereafter noting whether an electrical disruption may be due to, e.g., an electrical short or material failure in a particular area.

A group of metal wires 24 can be formed and positioned within a layer of electrically insulative or semiconductive material (e.g., a region of semiconductor material or an electrically insulating dielectric material), such that metal wires 24 transmit electricity between other electrically conductive structures in contact therewith. Metal wires 24 positioned within first metal level M1 can extend in a first direction (e.g., in parallel with axis Y), while metal wires 24 positioned within second metal level MN can extend in a second direction (e.g., in parallel with axis X) which is different from the first direction. Although the first and second directions are shown by example in FIG. 1 to be substantially perpendicular to one another, it is understood that the first and second directions can be oriented any non-parallel angle relative to each other. Metal wires 24 within different metal levels (e.g., first and second metal levels M1, MN) can be electrically connected to each other with vias 26 each extending vertically between first and second metal levels M1, MN. Vias 26 can be composed of the same electrically conductive material(s) as each metal wire 24, or can be composed of one or more different conductive materials. Vias 26 are shown with different cross-hatching to indicate that each via 26 extends vertically into IC chip 12. Each via 26, in an embodiment, can comprise any standard conductive metal (for example, copper) with a lining material (not shown) thereon, such as tantalum nitride.

Although monitor chain 14 can be operable to measure, e.g., shorts and opens throughout IC chip 12, the length of monitor chain 14 between first and second ends 16, 18, can affect the sensitivity of monitor chain 14 to changes in current and thereby cause an overly pessimistic measurement of whether defects have occurred. To compensate for these attributes of monitor chain 14, IC test structure 10 can include at least one first test wire 28 and at least one second test wire 30 positioned within IC chip 12. First test wire(s) 28 can be positioned within first metal level M1 with an orientation in the first direction, i.e., in parallel with metal wires 24. First test wire(s) 28 can also be electrically insulated from monitor chain 14, such that the behavior of current and voltages therein are independent from monitor chain 14 during testing. Where a plurality of first test wires 28 are included, a first spine wire 32 can electrically couple each first test wire 28 to a first test wire pad 34 for measuring, e.g., the electric current and/or voltage drop between the first test wire(s) 28 and monitor chain 14. First spine wire 32 can extend substantially in the second direction (e.g., in parallel with X axis) or in another direction perpendicular to and/or different from the direction of first test wires 28. Where a plurality of second test wires 30 are included, IC test structure 10 can include a second spine wire 36 electrically coupled to a second test wire pad 38. Second spine wire 36 can extend in the first direction (e.g., in parallel with Y axis), or can otherwise extend in a direction perpendicular to and/or different from second test wires 30. Each second test wire 30 can be electrically disconnected from both first test wire(s) 28 and monitor chain 14, such that second test wire pad 38 can be used to measure current and/or voltage behavior between second test wire(s) 30 and monitor chain 14.

In an embodiment, first test wire(s) 28, first spine wire 32, and/or first test wire pad 34 can each be positioned in the same metal level (e.g., first metal level M1). Second test wires 30, second spine wire 36, and/or second test wire pad 38 can each be positioned in a different metal level (e.g., second metal level MN). First and second test wire(s) 28, 30, can each extend laterally between a corresponding pair of metal wires 24, while remaining electrically disconnected from metal wires 24. In this arrangement, first and second test wire(s) 28, 30 can extend through intermediary metal levels positioned within monitor chain 14, thereby reducing the amount of space needed for IC test structure 10 and providing additional forms of testing. First and second test wires 28, 30 can each be free of vias (e.g., vias 26) electrically connected thereto, such that first and second test wires 28, 30 can constitute a self-contained testing element within a single metal level (e.g., first or second metal level M1, MN). During operation, the presence or absence of faults in IC chip 12 can be tested by applying test voltages across first and second test pads 20, 22 and/or first and second test wire pads 34, 38 to measure specific portions of IC chip 12, in addition to the properties of IC chip 12 as a whole by way of monitor chain 14.

Figure 2:
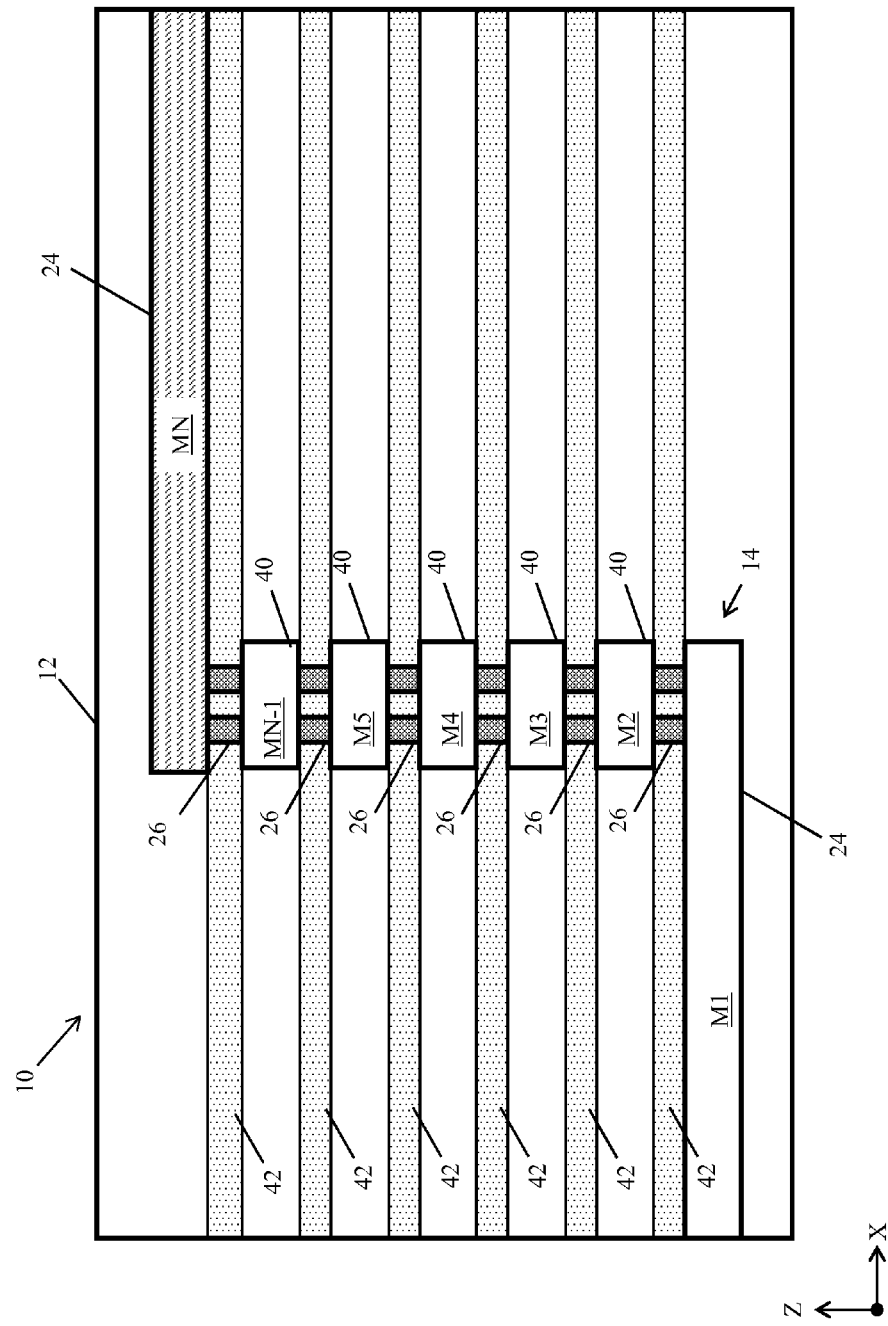
FIG. 2 shows a partial cross-sectional view in plane X-Z of the IC test structure according to embodiments of the present disclosure.

Turning to FIG. 2, a partial cross-sectional side view of IC test structure 10 is shown. First and second metal levels M1, MN can be separated from one another by one or more intervening metal levels 40 (each labeled, e.g., as M2, M3, M4, M5, MN-1). As suggested by the notations MN and M1, the number of metal layers can vary depending on the chosen implementation and any requirements for back end of line (BEOL) processing. IC test structure 10 can also include interlayer dielectrics 42 positioned between each intervening metal level 40. Each interlayer dielectric 42 can include one or more electrically insulative substances including, without limitation: silicon nitride ($Si_3N_4$), silicon oxide ($SiO_2$), fluorinated $SiO_2$ (FSG), hydrogenated silicon oxycarbide (SiCOH), porous SiCOH, boro-phospho-silicate glass (BPSG), silsesquioxanes, carbon (C) doped oxides (i.e., organosilicates) that include atoms of silicon (Si), carbon (C), oxygen (O), and/or hydrogen (H), thermosetting polyarylene ethers, SiLK (a polyarylene ether available from Dow Chemical Corporation), a spin-on silicon-carbon containing polymer material available from JSR Corporation, other low dielectric constant (<3.9) material, or layers thereof. In some embodiments, it is also understood that different interlayer dielectrics 42 can be composed of different materials with correspondingly different dielectric constants. In one embodiment, one or more vias 26 can extend from one metal level to an adjacent metal level, such that metal wire(s) 24 in first metal level M1 (e.g., a lowest metal level) can be electrically connected to metal wire(s) 24 in second metal level MN (e.g., an uppermost metal level of IC chip 12).

Figure 3:
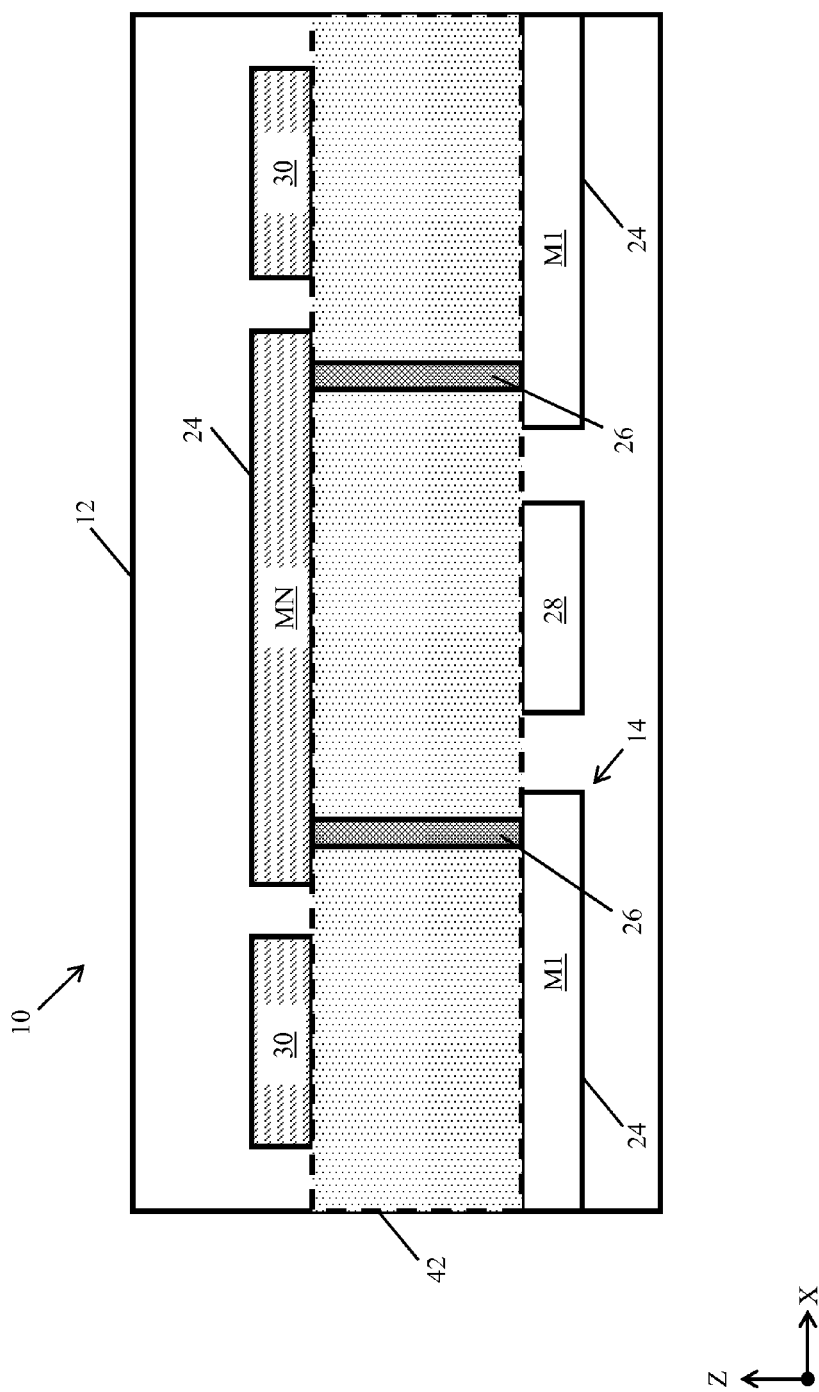
FIG. 3 shows another partial cross-sectional view in plane X-Z of the IC test structure according to embodiments of the present disclosure.

Referring to FIG. 3, another partial cross-sectional view of IC test structure 10 in an embodiment of the present disclosure is shown. In FIG. 3, interlayer dielectric 42 is shown in phantom to indicate a variable number of intervening metal levels 40 and dielectric layers 42 being positioned between first and second metal levels M1, MN. Monitor chain 14 can form a circuit extending through first and second metal levels M1, MN with vias 26 coupling individual metal wires 24 of monitor chain 14 together. Within first metal level M1, first test wire(s) 28 can be positioned laterally between a group of first metal wires 24, and can extend laterally into and/or out of the plane of the page. Similarly, second test wires 30 can be positioned laterally between a group of second metal wires 30 within second metal level MN, and can extend laterally into or and/or out of the plane of the page.

Figure 4:
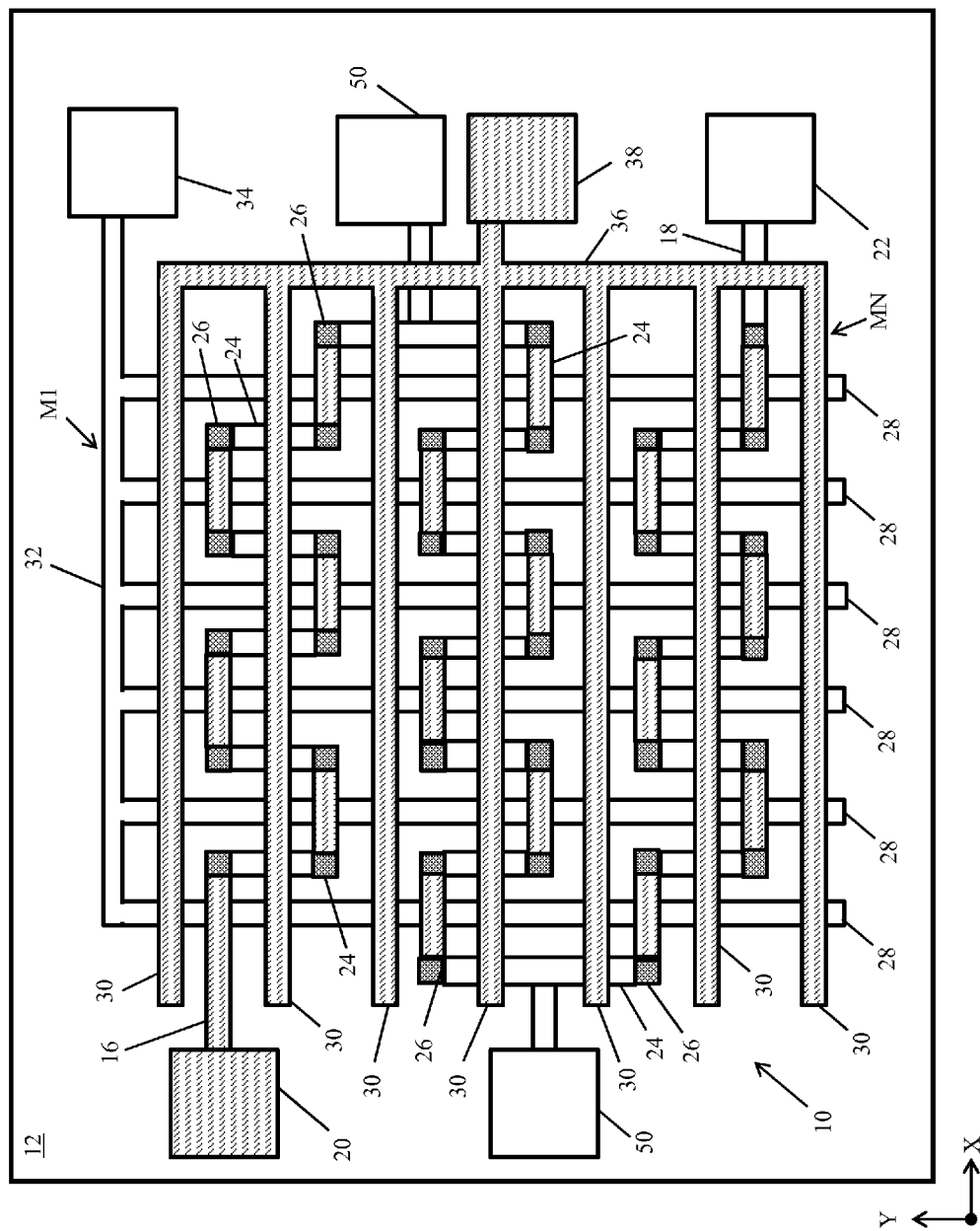
FIG. 4 shows a plan view in plane X-Y of another IC test structure according to embodiments of the present disclosure.

Turning now to FIG. 4, an embodiment of IC test structure 10 with additional structural features is shown. In particular, monitor chain 14 can optionally include one or more intermediate test pads 50 contacting monitor chain 14 at a position electrically between first and second ends 16, 18 thereof. Each intermediate test pad 50 can be positioned in the same metal level (e.g., each within first or second metal level M1, MN), or can be positioned within different metal levels. Intermediate test pads 50 can provide additional testing capability within IC test structure 10, e.g., by reducing the total voltage drop across monitor chain 14, and/or allowing for partial testing of monitor chain 14 after a failure of any vias 26 and/or interlayer dielectrics 42 (FIGS. 2, 3) in IC chip 12. Intermediate pads 50, together with first and/or second test wire pads 34, 38, can allow specific portions of IC chip 12 to be tested for electrical shorting and/or leakage by increasing the number of test components within IC chip 12, and with first and second test wires 28, 30 remaining electrically insulated from monitor chain 14.

Figure 5:
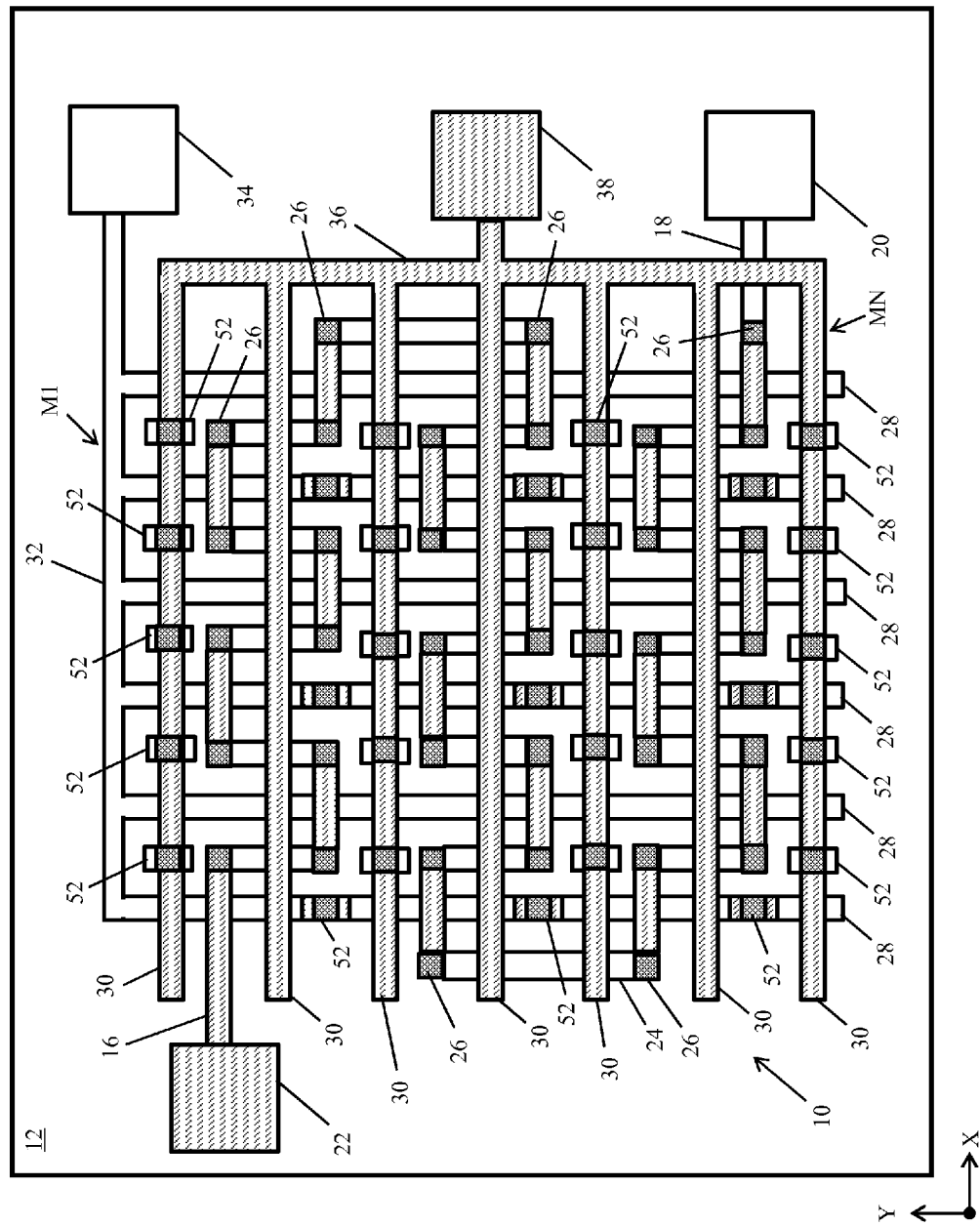
FIG. 5 shows a plan view in plane X-Y of yet another IC test structure according to embodiments of the present disclosure.

Turning to FIG. 5, another embodiment of IC test structure 10 is shown. IC structure 10 can include, e.g., monitor chain 14 electrically connecting first test pad 20 at first end 16 to second test pad 22 at second end 18. In addition first and second test wire(s) 28, 30 IC test structure 10 can include interconnect vias 52, electrically connecting each test wire 28, 30 to another metal level. For example, interconnect vias 52 can electrically connect first test wire(s) 28 from first metal level M1 to a portion of second metal level MN, while interconnect vias 52 can electrically connect second test wire(s) 30 from second metal level MN to a portion of first metal level M1. Although interconnect vias 52 can electrically connect first and second test wire(s) 28, 30 to other metal levels, each test wire 28, 30 can remain electrically insulated from monitor chain 14 to avoid creating an electrical short or merging separate test elements. For example, as is shown in FIG. 5, interconnect vias 52 can contact first and/or second test wires 28, 30 in positions where there are no vertically proximal test wires 28, 30 or metal wires 24 of monitor chain 14. Among other things, interconnect vias 52 being included in IC test structure 50 can allow for via-to-via testing within IC structure 10, thereby providing additional measurement of material stresses or failure.

As with other embodiments of IC test structure 10, interconnect vias 52 can contact one of a plurality of first and second test wires 28, 30 each positioned, e.g., between two corresponding first or second test wires 28, 30 and extending substantially in parallel therewith, to increase the versatility and coverage of IC test structure 10. It is also understood that the embodiments depicted in FIGS. 4 and 5 can be combined where applicable, such that intermediate test pads 50 (FIG. 4) can be provided together with interconnect vias 52 in a single implementation. In addition, some test wires 28, 30 can be free of interconnect vias 50 thereon, so as to maintain electrical isolation between monitor chain 14 and first and/or second test wires 28, 30.

Embodiments of the present disclosure described herein can offer several technical and commercial advantages, some of which are described by example herein. To measure electrical shorts, opens, and/or other properties such as dielectric reliability, a single embodiment of IC test structure 10 can provide multiple sources of testing through, e.g., monitor chain 14, first test wire(s) 28, and second test wire(s) 30 while reducing parasitic voltage drop across monitor chain 14 and other test devices. In addition, the ability to independently monitor the condition of IC chip 12 through first and second test wires 28, 30 can provide a test structure operable to determine the location of an electrical short or structural fault within monitor chain 14 or generally within IC chip 12, e.g., where monitor chain 14 yields a null response (e.g., a voltage or current of zero). It is also understood that testing performed according to embodiments of the present disclosure can be implemented and/or used in conjunction with circuits which provide a combinatorial logic. For example, a logic circuit or equivalent testing device electrically coupled to IC test structure 10 can provide Boolean attributes for testing, e.g., the presence or absence of breakdown in dielectric materials in particular regions or levels, and in accordance with predetermined attributes for the design and structure of IC test structure 10.

The methods and structures disclosed herein provide both a structure for testing the field viability of IC chips 12 relative to factors such as the number/width of interlayer dielectric materials (e.g., interlayer dielectrics 42) between metal levels. IC test structure 10 in particular can provide a testable structure in regions of IC chip 12 which include a high concentration of vias therein (e.g., vias 26). Using IC test structure 10 discussed herein, the properties of a proposed IC chip 12 can be measured during and/or after manufacture in order to determine, e.g., sizes or physical properties of interlayer dielectric(s) 42 which produce greater field viability. For example, if monitor chain 14 is disrupted or broken within a certain region, first and second test wire(s) 28, 30 can be used to determine a particular location or group of locations where failure occurred before taking corrective actions or design modifications.

The terminology used herein is for the purpose of describing particular embodiments only and is not intended to be limiting of the disclosure. As used herein, the singular forms "a," "an," and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

The corresponding structures, materials, acts, and equivalents of all means or step plus function elements in the claims below are intended to include any structure, material, or act for performing the function in combination with other claimed elements as specifically claimed. The description of the present disclosure has been presented for purposes of illustration and description, but is not intended to be exhaustive or limited to the disclosure in the form disclosed. Many modifications and variations will be apparent to those of ordinary skill in the art without departing from the scope and spirit of the disclosure. The embodiments were chosen and described in order to best explain the principles of the disclosure and the practical application, and to enable others of ordinary skill in the art to understand the disclosure for various embodiments with various modifications as are suited to the particular use contemplated.

We claim:

1. An integrated circuit (IC) test structure comprising:
   a monitor chain having a first end electrically connected to a second end through a plurality of metal wires each positioned within one of a first metal level and a second metal level, wherein the first metal level is vertically separated from the second metal level;
   a first test wire positioned within the first metal level and extending in a first direction, wherein the first test wire is electrically insulated from the monitor chain; and
   a second test wire positioned within the second metal level and extending in a second direction, wherein the second test wire is electrically insulated from the monitor chain and the first test wire, and wherein the first direction is different from the second direction.

2. The IC test structure of claim 1, wherein the first test wire comprises one of a plurality of first test wires positioned within the first metal level and extending in the first direction, and wherein each of the plurality of first test wires is electrically connected to a first spine wire extending in the second direction and positioned within the first metal level.

3. The IC test structure of claim 2, wherein at least one of the plurality of first test wires is positioned laterally between two of the plurality of metal wires.

4. The IC test structure of claim 2, wherein the second test wire comprises one of a plurality of second test wires positioned within the second metal level and extending in the second direction, and wherein each of the plurality of second test wires is electrically connected to a second spine wire extending in the first direction and positioned within the second metal level.

5. The IC test structure of claim 4, wherein at least one of the plurality of second test wires is positioned laterally between two of the plurality of metal wires.

6. The IC test structure of claim 1, further comprising a test pad electrically coupled to the monitor chain between the first end and the second end thereof.

7. The IC test structure of claim 1, wherein each of the first and second test wires are free of vias electrically connected thereto.

8. The IC test structure of claim 1, wherein at least one intervening metal level separates the first metal level from the second metal level.

9. An integrated circuit (IC) test structure comprising:
   a monitor chain having a first end electrically connected to a second end through a plurality of metal wires each positioned within one of a first metal level and a second metal level, wherein the first metal level is vertically separated from the second metal level;
   a first test wire positioned within the first metal level and extending in a first direction, wherein the first test wire is electrically insulated from the monitor chain; and
   a second test wire positioned within the second metal level and extending in a second direction, wherein the first direction is different from the second direction;
   an interconnect via electrically coupled to one of the first test wire and the second test wire, and extending from the first metal level to the second metal level.

10. The IC test structure of claim 9, wherein the first test wire comprises one of a plurality of first test wires positioned within the first metal level and extending in the first direction, and wherein each of the plurality of first test wires is electrically connected to a first spine wire extending in the second direction and positioned within the first metal level.

11. The IC test structure of claim 10, wherein the interconnect via is electrically coupled to one of the plurality of first test wires, and positioned laterally between two of the plurality of test wires.

12. The IC test structure of claim 10, wherein the interconnect via comprises one of a plurality of interconnect vias, each of the plurality of interconnect vias being coupled to one of the plurality of first test wires, and wherein at least one of the plurality of first test wires is free of interconnect vias electrically connected thereto.

13. The IC test structure of claim 10, wherein at least one of the plurality of first test wires is positioned laterally between two of the plurality of metal wires.

14. The IC test structure of claim 10, wherein the second test wire comprises one of a plurality of second test wires positioned within the second metal level and extending in the second direction, and wherein each of the plurality of second test wires is electrically connected to a second spine wire extending in the first direction and positioned within the second metal level.

15. The IC test structure of claim 9, further comprising a test pad electrically coupled to the monitor chain between the first end and the second end thereof.

16. The IC test structure of claim 9, wherein at least one intervening metal level separates the first metal level from the second metal level.

17. An integrated circuit (IC) test structure comprising:
a monitor chain having a first end electrically connected to a second end through a plurality of metal wires each positioned within one of a first metal level and a second metal level, wherein the first metal level is vertically separated from the second metal level;
a plurality of first test wires each positioned within the first metal level and extending in a first direction, wherein each of the plurality of first test wires is electrically insulated from the monitor chain and positioned laterally between two of the plurality of metal wires; and
a plurality of second test wires each positioned within the second metal level and extending in a second direction, wherein each of the plurality of second test wires is electrically insulated from the monitor chain and positioned laterally between two of the plurality of metal wires, and wherein the first direction is different from the second direction.

18. The IC test structure of claim 17, further comprising:
a first spine wire positioned within the first metal level and electrically connected to the plurality of first test wires, wherein the first spine wire extends in the second direction;
a second spine wire positioned within the second metal level and electrically connected to the plurality of second test wires, wherein the second spine wire extends in the first direction.

19. The IC test structure of claim 17, further comprising a plurality of interconnect vias each electrically coupled to one of the first test wire and the second test wire, and extending from the first metal level to the second metal level.

20. The IC test structure of claim 17, wherein each of the plurality of first test wires and the plurality of second test wires are free of vias electrically connected thereto.

* * * * *